(12) United States Patent
Qin

(10) Patent No.: US 10,892,389 B2
(45) Date of Patent: Jan. 12, 2021

(54) PACKAGING LEADFRAME AND PACKAGING STRUCTURE

(71) Applicant: KAISTAR Lighting (Xiamen) Co., Ltd, Xiamen (CN)

(72) Inventor: Guoheng Qin, Xiamen (CN)

(73) Assignee: KAISTAR LIGHTING (XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 16/205,278

(22) Filed: Nov. 30, 2018

(65) Prior Publication Data
US 2019/0181312 A1   Jun. 13, 2019

(30) Foreign Application Priority Data
Dec. 8, 2017 (CN) .......................... 2017 1 1292982

(51) Int. Cl.
| | |
|---|---|
| *H01L 33/60* | (2010.01) |
| *H01L 33/62* | (2010.01) |
| *H01L 33/48* | (2010.01) |
| H01L 33/54 | (2010.01) |
| H01L 33/38 | (2010.01) |

(52) U.S. Cl.
CPC ............ *H01L 33/60* (2013.01); *H01L 33/486* (2013.01); *H01L 33/62* (2013.01); *H01L 33/387* (2013.01); *H01L 33/54* (2013.01); *H01L 2933/0058* (2013.01); *H01L 2933/0066* (2013.01); *H01L 2933/0091* (2013.01)

(58) Field of Classification Search
CPC ....... H01L 33/60; H01L 33/486; H01L 33/62; H01L 2933/0091; H01L 2933/0058; H01L 2933/0066; H01L 2933/0033; H01L 33/48; H01L 33/387; H01L 33/54
See application file for complete search history.

(56) References Cited

U.S. PATENT DOCUMENTS

2011/0006322 A1*  1/2011  Li ....................... H01L 33/486
                                                              257/98
2016/0319867 A1*  11/2016  Adam ..................... C08L 81/04

FOREIGN PATENT DOCUMENTS

CN            102119452          7/2011

* cited by examiner

*Primary Examiner* — Patricia D Reddington
(74) *Attorney, Agent, or Firm* — Hemisphere Law, PLLC; Zhigang Ma

(57) ABSTRACT

The present application relates to a packaging leadframe and a packaging structure. The packaging leadframe includes a substrate layer and a sidewall structure. A surface of the substrate layer is provided with at least one metal bump structure, a circuit layer also is laid on the surface of the substrate layer and can be electrically coupled with a LED chip. The sidewall structure is disposed on the surface with the metal bump structure, and includes a halocarbon polymer matrix and a plurality of light reflective particles uniformly mixed together. The halocarbon polymer may be poly tetra fluoroethylene or polyvinylidene fluoride. In this regard, the packaging leadframe has high reflectivity to ultraviolet light and good resistance to ultraviolet radiation.

18 Claims, 4 Drawing Sheets

PACKAGING LEADFRAME AND PACKAGING STRUCTURE

FIELD OF THE DISCLOSURE

The disclosure relates to the field of package technologies, and more particularly to a packaging leadframe and a packaging structure.

BACKGROUND

Ultraviolet (UV) light emitting diodes (LEDs) emit ultraviolet light with characteristics of short wavelength and high light energy, and are widely used in various fields of application in industry, medical care, and hygiene.

However, there is a great technical challenge for the materials required for UV LED packaging due to the characteristics of high ultraviolet light energy.

The conventional materials used in packaging leadframe, whether epoxy-type materials, silicone-based materials, or ceramic-type materials, have low reflectivity in the ultraviolet region, especially in the deep ultraviolet region, thereby they are not good for improving the light extraction efficiency (LEE) of the ultraviolet light.

In addition, materials such as epoxy resins and silicone resins have poor resistance for ultraviolet light. The packaging leadframe made by these materials are prone to ageing exposed in the ultraviolet wavelength, which will affect the lifetime and reliability of light source.

Therefore, one of research purposes for this technical field is how to improve the material for packaging leadframe with high reflectivity for ultraviolet light and good anti-ultraviolet radiation capability.

SUMMARY

On such basis, the present disclosure provides a packaging leadframe and a packaging structure, which improves the material of the packaging leadframe, has higher reflectivity for ultraviolet light, and has good resistance to ultraviolet radiation.

To achieve at least one of the advantages or other advantages, one embodiment of the present disclosure provides a packaging leadframe. The packaging leadframe includes a substrate layer and a sidewall structure.

The sidewall structure is disposed on the substrate layer, which material is the mixture of halogen carbon polymer and light reflective particles. The light reflective particles have high reflectivity for light wavelength in the range of 200 nanometers (nm) to 400 nm. For example, the light reflective particles are the barium sulfate ($BaSO_4$) particles, or calcium carbonate ($CaCO_3$) particles, or a mixture of barium sulfate particles and calcium carbonate particles. Barium sulfate particles and calcium carbonate particles can increase the hardness of the sidewall structure and also improve the sidewall reflectivity for ultraviolet light.

As the aforementioned packaging leadframe, the substrate layer may be a ceramic substrate, and the ceramic substrate has circuit structures penetrating through two opposite surfaces thereof.

As the aforementioned packaging leadframe, the halogen element in the halocarbon polymer may be fluorine or chlorine, and the halocarbon polymer may be polytetrafluoroethylene (PTFE) or polyvinylidene fluoride (PVDF). PTFE and PVDF have good resistance to ultraviolet light and high reflectivity for ultraviolet light.

Further, the light reflective particles may have particle sizes in the range of 0.07 microns (μm) to 15 μm.

A solid content of the light reflective particles in the sidewall material is in the range of 5% to 25%.

It is further illustrated that the surface of the substrate layer is provided with at least one metal bump structure, and the sidewall structure is disposed on the surface of the substrate layer with the metal bump structure. The metal bump structure can make the substrate layer and the sidewall structure have excellent bonding performance.

PTFE and PVDF have good UV light reflectivity and resistance to UV radiation. The reflectivity in the UV wavelength is more than 80%. PTFE and PVDF are excellent materials for a packaging leadframe, and especially used in the UV LED packaging leadframe. In addition, PTFE or PVDF packaging leadframe has high chemical stability and excellent corrosion resistance, that is, it is resistant to strong acids, strong alkalis, and strong oxidants. They have excellent high and low temperature characteristics, PTFE can be used long term in the temperature range of −190 degree centigrade (° C.) to 260° C., PVDF can be used long term in −60° C. to 150° C.

However, the hardness of PTFE or PVDF material is low, and it can be improved by adding barium sulfate particles or calcium carbonate particles. $BaSO_4$ particles and $CaCO_3$ particles have a good UV light reflectivity. The modified packaging leadframe not only increases the reflectivity in the UV light, but also increases the hardness and wear resistance. Therefore, the performance of the packaging leadframe of the present disclosure has been greatly improved.

In addition, when the sidewall structure is disposed on the substrate layer, the metal bump structure is disposed on the surface of the substrate layer in order to increase the interfacial bonding strength between the halocarbon polymer such as PTFE and PVDF and the ceramic substrate.

As above, the present disclosure discloses a packaging leadframe, which uses light reflective particles such as $BaSO_4$ particles and $CaCO_3$ particles to mix in and modify the halocarbon polymers such as PTFE, wherein PTFE has high reflectivity to ultraviolet light and good resistance to ultraviolet radiation.

The above description is merely an overview of the technical solution of the present disclosure. In the following, description will be given in detail on the exemplary embodiments of the present disclosure, in connection with the accompanying drawing. Although drawings show the exemplary embodiments of the present disclosure, it should be appreciated that the present disclosure may be implemented in various ways without being limited by the embodiments set forth herein. On the contrary, these embodiments are provided for thorough understanding of the present disclosure, and completely conveying the scope of the present disclosure to the skills in the art.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
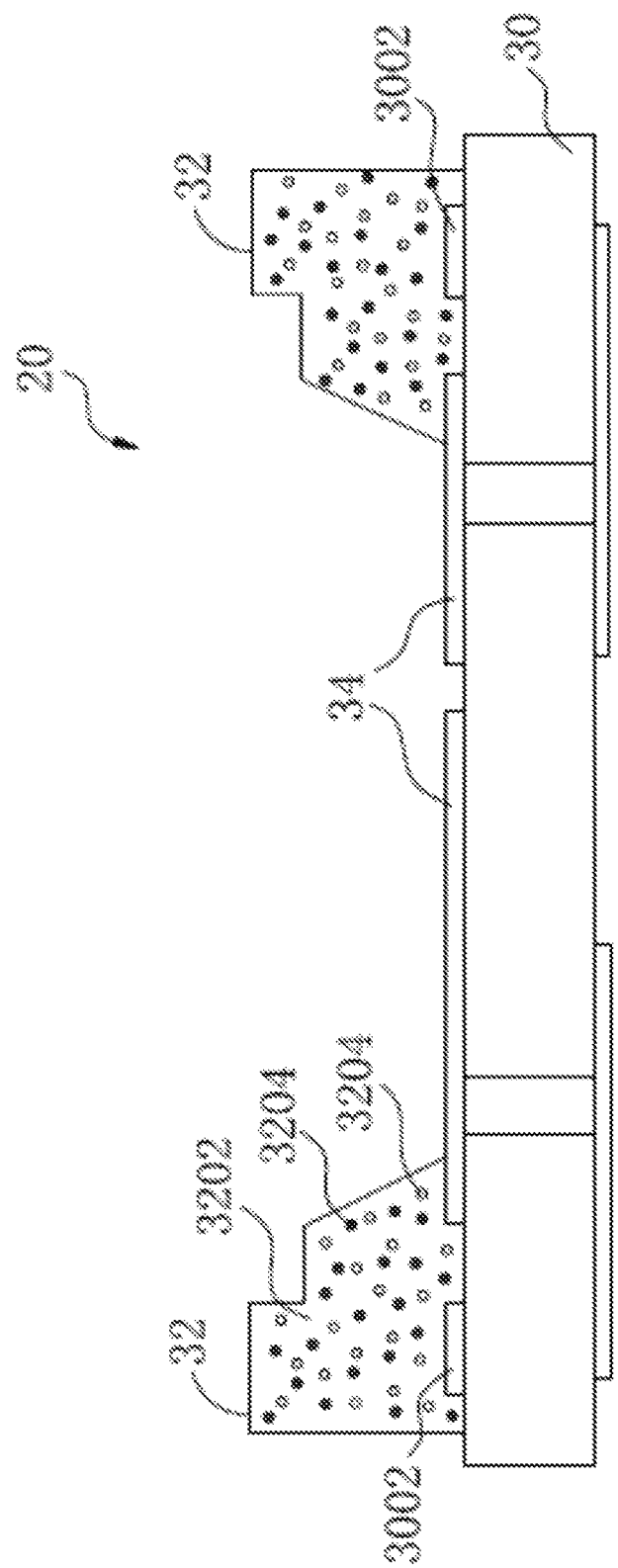
FIG. 1 is a cross-sectional schematic view of a packaging leadframe according to one embodiment of the disclosure.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

FIG. 1 is a cross-sectional view of a packaging leadframe 20 according to the present disclosure. An embodiment of the disclosure provides the packaging leadframe 20, including a substrate layer 30 and a sidewall structure 32.

A surface of the substrate layer 30 is provided with at least one metal bump structure 3002. The metal bump structure 3002 can improve the bonding strength of the substrate layer 30 and the sidewall structure 32. The surface of the substrate layer 30 is also provided with a circuit layer 34 for transmitting the electricity required by the light emitting diode chip.

The sidewall structure 32 is disposed on the substrate layer 30, in further, the sidewall structure 32 is disposed on the surface of the substrate layer 30 having the metal bump structure 3002. The sidewall structure 32 includes a halocarbon polymer 3202 and a plurality of light reflective particles 3204. A halogen element in the halocarbon polymer 3202 is fluorine or chlorine, that is, the halocarbon polymer may be fluorocarbon polymer or chlorocarbon polymer. The plurality of light reflective particles 3204 are particles having a high reflectivity to light having a wavelength in a range of 200 nanometers (nm) to 400 nm, the plurality of particles refers to a plurality of barium sulfate particles ($BaSO_4$), a plurality of calcium carbonate particles ($CaCO_3$), or a mixture of the two particles. In other words, a matrix of the sidewall structure 32 is halocarbon polymer 3202, and light reflective particles 3204 such as powdery barium sulfate particles or powdery calcium carbonate particles are mixed and dispersed in the matrix, thereby improving the hardness and wear resistance of the halocarbon polymer 3202.

In one embodiment, the substrate layer 30 may be, for example, a ceramic substrate, and the circuit layer 34 is a circuit structure that penetrates two opposite surfaces of the ceramic substrate, circuits on the two opposite surfaces are electrically connected to each other via through hole. The halocarbon polymer 3202 may be, for example, a fluorocarbon polymer such as poly tetra fluoroethylene (PTFE) or polyvinylidene fluoride (PVDF). The PTFE and PVDF each are capable of improving the reflectivity in the ultraviolet band and improving the resistance to ultraviolet radiation.

Particle sizes of the light reflective particles 3204 are in the range of 0.07 microns (μm) to 15 μm. A solid content of the light reflective particles 3204 in the sidewall structure 32 is in the range of 5% to 25%.

If the particle sizes of the light reflective particles 3204 are too small, the particles 3204 tend to cause agglomeration, which is not conducive to the dispersion of the light reflective particles 3204. As such, it is necessary to add more dispersant to adequately disperse the light reflective particles 3204, and thereby resulting excessive final shrinkage. In addition, if the particle sizes of the light reflective particles 3204 are too large, the light reflective particles 3204 tend to precipitate, which may result in non-uniform mixing and a decrease in reflectivity, and may also affect the surface roughness of the sidewall structure 32. Therefore, proper particle sizes of the light reflective particles 3204 can indeed solve the technical problems that have not been overcome in the art for a long time.

In addition, if the ratio of the solid content of the light reflective particles 3204 is too small, the hardness of the sidewall structure 32 will be low, and the reflectivity of the sidewall structure 32 will also be unfavorable. However, if the ratio of the solid content of the light reflective particles 3204 is too large, the brittleness of the sidewall structure 32 will be too large, and the strength of the sidewall structure 32 will be affected. Therefore, a proper ratio of solid content of the light reflective particles 3204 can indeed solve the technical problem that has not been overcome in the art for a long time.

Halocarbon polymers, especially chlorinated and fluorinated polymers, and in particular PTFE and PVDF, have good UV light reflectivity and resistance to UV radiation. Through practical tests, the reflectivity in UV light can exceed 80%. And, both have the characteristics of aging resistance. Therefore, the present disclosure adopts PTFE or PVDF as examples of the material of the halocarbon polymer 3202 of the packaging leadframe 20. In particular, it also facilitates to mount a light emitting diode with ultraviolet light. In addition, PTFE or PVDF packaging leadframe 20 has high chemical stability and excellent corrosion resistance, that is, it is resistant to strong acids, strong alkalis, and strong oxidants. It further has excellent high and low temperature characteristics, PTFE can be used long term in the temperature range of −190° C. to 260° C., PVDF can be used long term in the temperature range of −60° C. to 150° C.

However, the hardness of PTFE or PVDF material is low, and it can be modified by adding powdery barium sulfate particles or powdery calcium carbonate particles. $BaSO_4$ particles and $CaCO_3$ particles also have a good UV light reflectivity. The modified packaging leadframe 20 not only increases the reflectivity in the UV light, but also increases the hardness and wear resistance. Therefore, the performance of the packaging leadframe 20 of the present disclosure has been greatly improved.

In addition, when the sidewall structure 32 is disposed on the substrate layer 30, the metal bump structure 3002 is disposed on the surface of the substrate layer 30 in order to increase the interfacial bonding strength between the halocarbon polymer 3202 such as PTFE or PVDF and the ceramic substrate.

Figure 2:
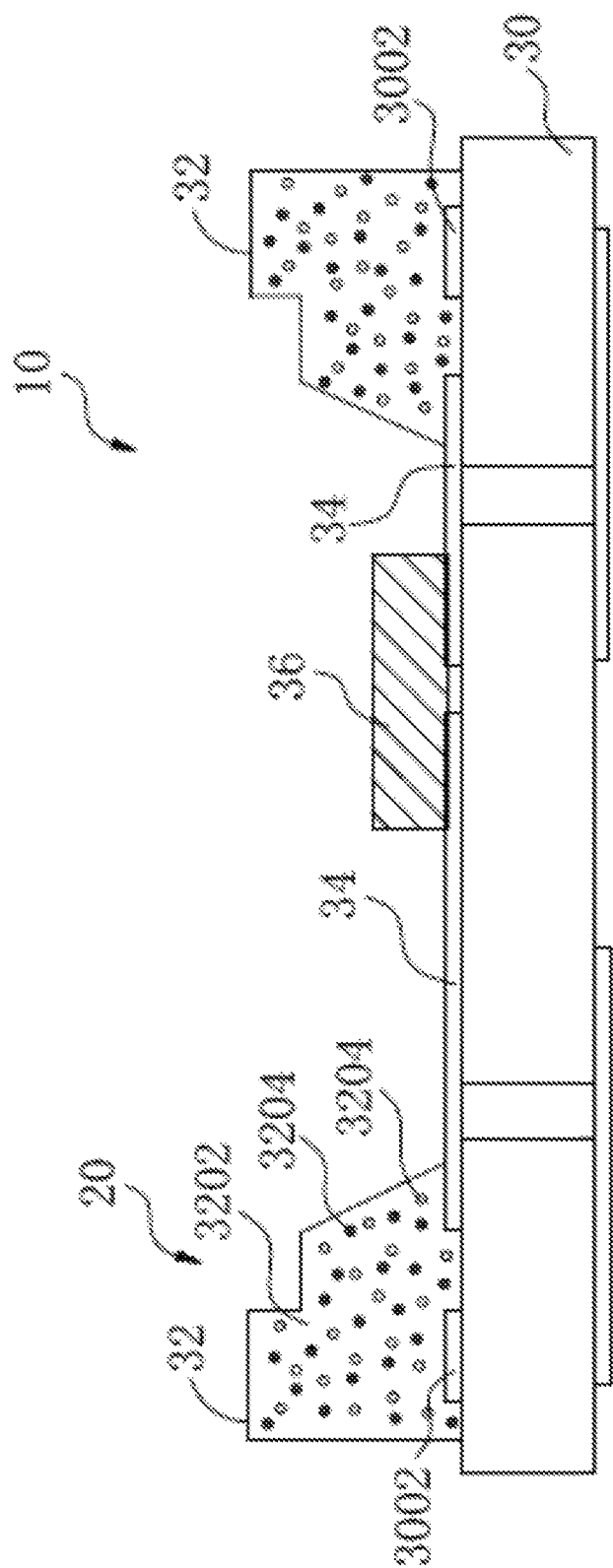
FIG. 2 is a cross-sectional schematic view of a packaging structure according to one embodiment of the disclosure.

Please referring to FIG. 2, FIG. 2 is a cross-sectional view of a packaging structure 10 of the disclosure. One embodiment of the disclosure provides the packaging structure 10, which includes the packaging leadframe 20, a circuit layer 34, and a light emitting diode (LED) chip 36. The packaging leadframe 20 further includes a substrate layer 30 and a sidewall structure 32.

The sidewall structure 32 is disposed on the surface of the substrate layer 30 having the metal bump structure 3002, and surrounds the LED chip 36. The sidewall structure 32 includes a halocarbon polymer 3202 and a plurality of light reflective particles 3204. The light reflective particles 3204 may be a plurality of $BaSO_4$ particles, or a plurality of $CaCO_3$ particles, or a mixture of the $BaSO_4$ particles and $CaCO_3$ particles. The halocarbon polymer 3202 may be PTFE and/or PVDF.

Figure 3:
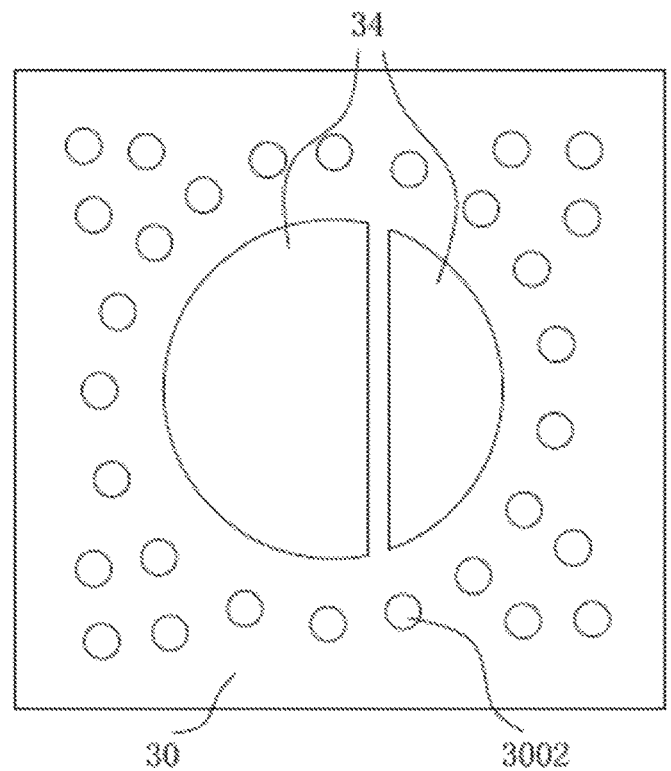
FIG. 3 is top view of a substrate layer according to one embodiment of the disclosure.

Please refer to FIG. 3, which is a top view of the substrate layer 30 of the present disclosure. The substrate layer 30 may be, for example, a ceramic substrate. The surface of the substrate layer 30 has at least one metal bump structure 3002, and there are a plurality of metal bump structures 3002 shown in the figure.

When the sidewall structure 32 is disposed on the substrate layer 30, the metal bump structure 3002 is disposed on the surface of the substrate layer 30 in order to increase the interfacial bonding strength between the halocarbon polymer 3202 such as PTFE or PVDF and the ceramic substrate.

Further, the circuit layer 34 is laid on the surface of the substrate layer 30. The circuit layer 34 includes an anode and a cathode, so that the electrical energy required for the LED chip 36 is provided subsequently. The circuit layer 34 may also include a circuit structure penetrating the two opposite surfaces of the ceramic substrate, wherein circuits on the two opposite surfaces are electrically connected to each other through a through hole. With reference to FIG. 2, it can be understood that the LED chip 36 is electrically coupled to the circuit layer 34, further illustrated that the LED chip 36 is electrically coupled to the anode and the cathode of the circuit layer 34.

Figure 4:
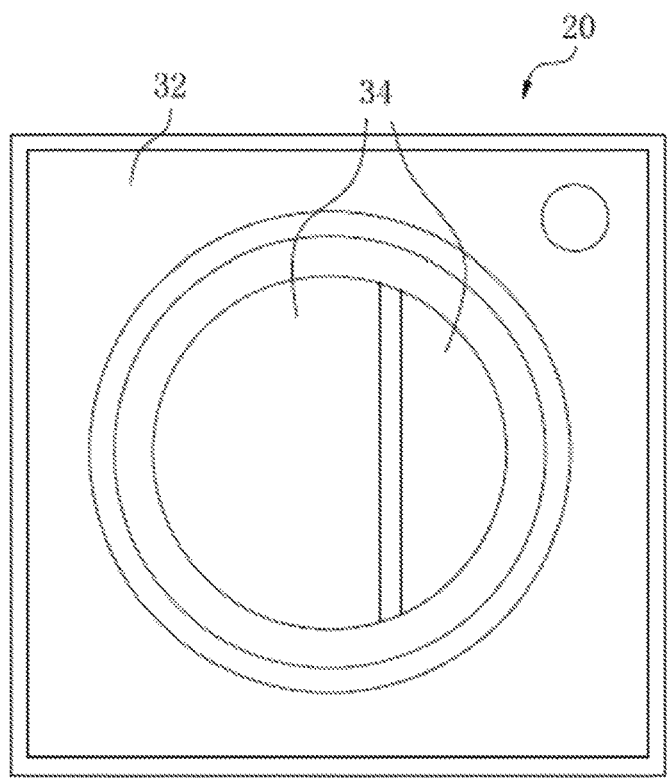
FIG. 4 is a top view of the packaging leadframe according to one embodiment of the disclosure.

Cooperating with FIG. 2, please refer to FIG. 4, which is a top view of the packaging leadframe 20 according to the present disclosure. The packaging leadframe 20 as shown is already in the form of a packaging leadframe product and serves as a component required for the package. The anode and the cathode of the circuit layer 34 can be seen from the top view, such structure can facilitate the packaging process of mounting the LED chip 36 and electrically coupling to the circuit layer 34. It is also shown that the sidewall structure 32 is like a cup-shaped ring surrounding the LED chip 36, an inner side wall of the wall structure 32 can be used as a light reflective surface so that light emitted from the LED chip 36 can be directed upward.

In the packaging structure 10 described above as shown in FIG. 2, particle sizes of the light reflective particles 3204 are in the range of 0.07 μm to 15 μm, a solid content of the $BaSO_4$ particles or $CaCO_3$ particles in the sidewall structure 32 is in the range of 5% to 25%.

PTFE and PVDF have good UV light reflectivity and good resistance to UV radiation. The reflectivity in the UV light can exceed 80%. PTFE and PVDF are excellent materials for the packaging leadframe 20, and particularly for usage of mounting an ultraviolet LED. In addition, PTFE or PVDF packaging leadframe 20 has high chemical stability and excellent corrosion resistance, that is, it is resistant to strong acids, strong alkalis, and strong oxidants. It further has excellent high and low temperature characteristics, PTFE can be used long term in the temperature range of −190° C. to 260° C., PVDF can be used long term in the temperature range of −60° C. to 150° C.

However, the hardness of PTFE or PVDF material is low, and it can be modified by adding powdery barium sulfate particles or powdery calcium carbonate particles. $BaSO_4$ particles and $CaCO_3$ particles also have a good UV light reflectivity. The modified packaging leadframe 20 not only increases the reflectivity in the UV light, but also increases the hardness and wear resistance. Therefore, the performance of the packaging leadframe 20 of the present disclosure has been greatly improved.

In addition, when the sidewall structure 32 is disposed on the substrate layer 30, the metal bump structure 3002 is disposed on the surface of the substrate layer 30 in order to increase the interfacial bonding strength between the halocarbon polymer 3202 such as PTFE or PVDF and the ceramic substrate.

It is noted that the metal bump structure 3002 can be formed by metallization methods such as electroplating or sintering, and can be completed synchronously with the circuit layer 34, or can be completed in steps with the circuit layer 34.

Figure 5:
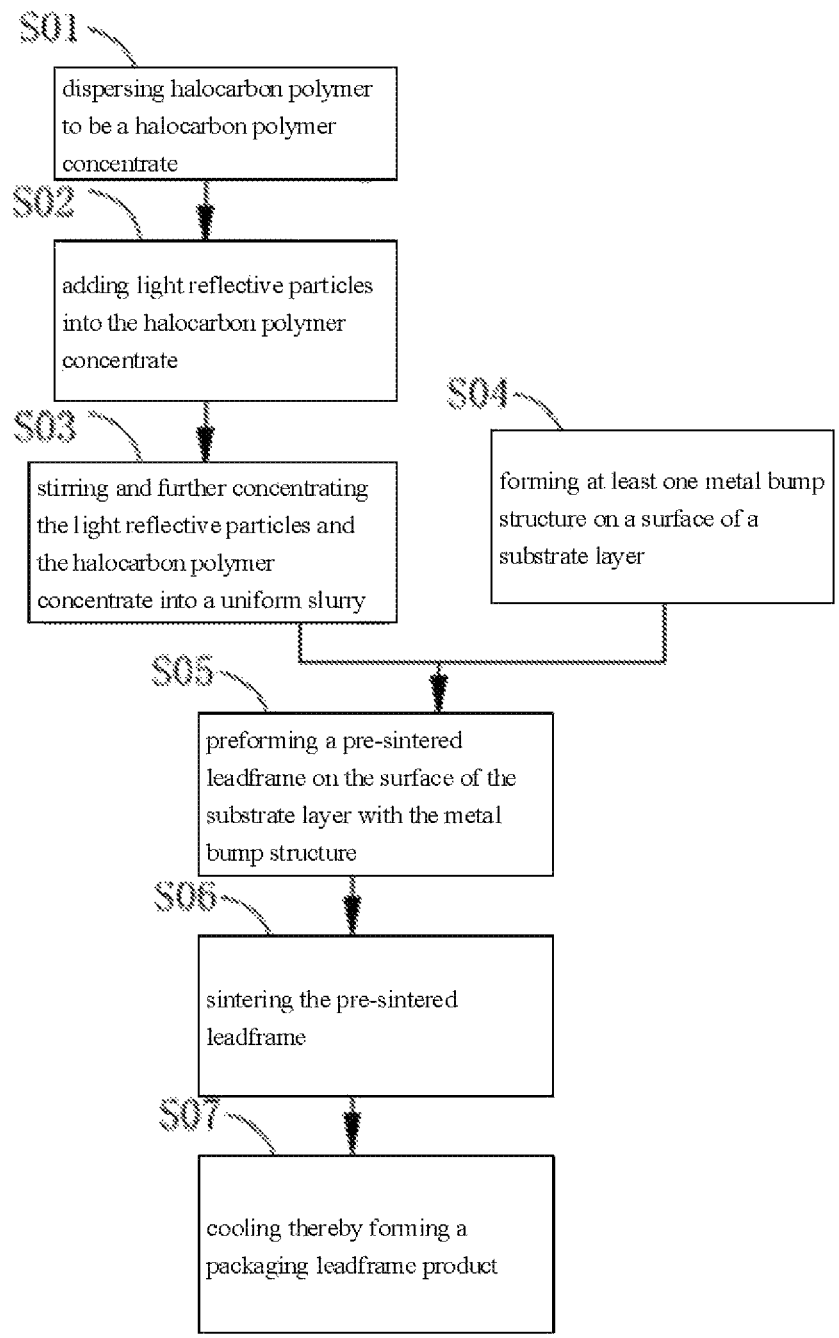
FIG. 5 is a flowchart of a method for manufacturing the packaging leadframe according to one embodiment of the disclosure.

In addition, another embodiment of the present disclosure provides a method for manufacturing the packaging leadframe 20. Referring to FIG. 5, which is a flowchart of a method for manufacturing the packaging leadframe 20 according to the present disclosure. The present disclosure relates to a method for manufacturing the packaging leadframe 20, which includes the substrate layer 30 and the sidewall structure 32. The manufacturing method includes the following steps.

Step 1 (S01), the halocarbon polymer is dispersed to be a halocarbon polymer concentrate. A solid content of the halocarbon polymer concentrate is proper from 50% to 70%, preferably from 55% to 65%, for example 60%. In one embodiment, the halogen element in the halocarbon polymer is fluorine or chlorine. In another embodiment, the halocarbon polymer is PTFE and/or PVDF.

Step 2 (S02), the light reflective particles 3204 are added into the above-mentioned halocarbon polymer concentrate. The light reflective particles 3204 are 5% to 25% by weight of the total solid content. The light reflection particles 3204 have high reflectivity to light in the wavelength range from 200 nm to 400 nm, for example, the reflectivity is over 80%, more than 85%, or even more than 92%. In some embodiments, the light reflective particles 3204 are $BaSO_4$, $CaCO_3$, or a mixture of the two. In some embodiments, particle sizes of the light reflective particles 3204 are between 0.07 μm to 15 μm to ensure dispersion uniformity.

Step 3 (S03), the light reflective particles 3204 and the halocarbon polymer concentrate are stirred and further concentrated into a uniform slurry. A solid content of the slurry is controlled in the range of 75% to 90% by weight, the viscosity of the slurry is controlled in the range of 0.1 Pa·s to 10 Pa·s.

Step 4 (S04), at least one metal bump structure is formed on the surface of the substrate layer. The metal bump structure provided on the surface of the substrate layer can increase the interfacial bonding strength between the halocarbon polymer and the substrate layer. In one embodiment, the substrate layer is a ceramic substrate, and the ceramic substrate has a circuit layer that penetrates through two opposite surfaces. In one embodiment, the metal bump structure is formed synchronously with the circuit layer.

Step 5 (S05), a pre-sintered leadframe is preformed on the surface of the substrate layer having the metal bump structure, using the slurry prepared above. The substrate layer cooperates with a corresponding mold, the slurry is injected into the mold, and then is heated in the mold to a certain temperature about 150° C. to 250° C., for drying and pre-sintering molding. After demoulding, a pre-sintered leadframe is obtained, in which the substrate layer and the slurry material are combined.

Step 6 (S06), the pre-sintered leadframe is further sintered. The pre-sintered leadframe 20 is sintered in vacuum, or in a nitrogen atmosphere containing less than 400 parts per million of oxygen, wherein the sintering temperature is controlled in the range of 330° C. to 380° C., and the sintering time is in the range of 1 hour to 20 hours.

Step 7 (S07), the pre-sintered leadframe is cooled to form a packaging leadframe product. A slow cooling rate of 20° C. to 60° C. per hour is controlled to produce the packaging leadframe product.

The following is a description of a specific embodiment. A PTFE resin concentrate made of dispersion polymerization is used as a main raw material, and the solid content of the PTFE resin is 60%. A certain proportion of light reflective particles 3204 such as $BaSO_4$ particles and $CaCO_3$ particles are added into the PTFE resin concentrate. A total solid content of the $BaSO_4$ particles and $CaCO_3$ particles is 5% to 25%. The mixture is stirred at 2 rpm and then further concentrated into a uniform and stable slurry at room temperature (e.g., 25° C.), wherein the solid content of the slurry is in the range of 75% to 90%, and the viscosity of the slurry is in the range of 0.1 Pa·s to 10 Pa·s.

A ceramic substrate correspondingly metalized as circuit layer 34 is prepared as a base material, and an upper surface of the ceramic substrate corresponding to the sidewall structure 32 defines a plurality of metal bump structures 3002. The thickness of the metal bump structure 3002 is in the range of 18 μm to 100 μm, the area of the single metal bump structure 3002 is in the range of 0.0025 $mm^2$ to 1 $mm^2$. These metal bump structures 3002 can enhance the interfacial bonding strength between the PTFE and the ceramic substrate.

The substrate layer cooperates with a corresponding mold, the slurry is injected into the mold, and then is heated to a certain temperature about 150° C. to 250° C., for drying and pre-sintering molding. After the demoulding step, a pre-sintered packaging leadframe 20 can be obtained after the ceramic substrate is combined with the sidewall structure 32.

The pre-sintered packaging leadframe 20 is sintered in vacuum or in a nitrogen atmosphere containing less than 400 parts per million of oxygen, wherein the sintering temperature is controlled in the range of 330° C. to 380° C., and the sintering time is in the range of 1 hour to 20 hours. Then, a slow cooling process is performed at a temperature falling rate of 20° C. to 60° C. per hour. In this way, not only the reflectivity of the packaging leadframe 20 is increased, but also the hardness and wear resistance can be increased, and the stress of the packaging leadframe 20 itself can be eliminated, to produce the packaging leadframe 20 in the present disclosure.

In summary, the packaging leadframe 20, the packaging structure 10, and the method for manufacturing the packaging leadframe 20 of the present disclosure, uses light reflective particles such as barium sulfate particles and calcium carbonate particles to modify and be mixed with halocarbon polymer such as PTFE, PVDF, or even polyvinyl chloride, thereby improving the material of the packaging leadframe 20. As such, the packaging leadframe 20 has high reflectivity to ultraviolet light and good resistance to ultraviolet radiation.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A packaging lead frame, comprising:
   a substrate layer, disposed with a circuit layer wherein the circuit layer has a cathode and an anode arranged on an upper surface of the substrate layer, and the cathode and the anode are configured for electrically connecting with a light emitting diode (LED) chip and whereby the cathode as well as the anode are located between the upper surface and the LED chip; and
   a sidewall structure disposed on the substrate layer, wherein the materials of sidewall structure comprises a halocarbon polymer and a plurality of light reflective particles uniformly mixed together, the sidewall structure is ring-shaped to expose the cathode and the anode and further is configured for reflecting light emitted from the LED chip, and the plurality of light reflective particles are configured for increasing a reflectivity of the halocarbon polymer to the light.

2. The packaging lead frame according to claim 1, wherein the substrate layer is a ceramic substrate.

3. The packaging lead frame according to claim 2, wherein the ceramic substrate comprises circuit structures penetrating through two opposite sides of the ceramic substrate to form the circuit layer.

4. The packaging lead frame according to claim 1, wherein the halocarbon polymer is selected from the group consisting of poly tetra fluoroethylene and polyvinylidene fluoride.

5. The packaging lead frame according to claim 1, wherein a reflectivity of the plurality of light reflective particles is over 80%, for light in a wavelength range from 200 nm to 400 nm.

6. The packaging lead frame according to claim 1, wherein particle sizes of the plurality of light reflective particles are in the range of 0.07 microns to 15 microns.

7. The packaging lead frame according to claim 1, wherein the plurality of light reflective particles are barium sulfate particles, or calcium carbonate particles, or a mixture of the barium sulfate particles and the calcium carbonate particles.

8. The packaging lead frame according to claim 1, wherein a solid content of the plurality of light reflective particles in the sidewall structure is in the range of 5% to 25%.

9. The packaging lead frame according to claim 1, wherein at least one metal bump structure is defined on the upper surface of the substrate layer, and the sidewall structure is disposed on the upper surface of the substrate layer and in contact with the at least one metal bump structure.

10. A packaging structure, comprising:
a substrate layer comprising a mounting surface;
a circuit layer formed on the mounting surface;
a plurality of metal bumps formed on the mounting surface and surrounding the circuit layer;
a sidewall structure disposed in contact with the metal bumps, wherein the sidewall structure comprises a halocarbon polymer matrix and a plurality of light reflective particles uniformly dispersed in the halocarbon polymer matrix; and
a light emitting diode chip mounted on and electrically coupled to the circuit layer, wherein the sidewall structure surrounds the light emitting diode chip;
wherein the sidewall structure is configured for reflecting light emitted from the light emitting diode chip, and the plurality of light reflective particles are configured for increasing a reflectivity of the halocarbon polymer to the light;
wherein the sidewall structure is disposed covering the metal bumps and thereby the metal bumps are located between the substrate layer and the sidewall structure so as to increase a bonding strength of the substrate layer with the sidewall structure.

11. The packaging structure according to claim 10, wherein the substrate layer is a ceramic substrate.

12. The packaging structure according to claim 10, wherein the halocarbon polymer contains at least one of poly tetra fluoroethylene and polyvinylidene fluoride.

13. The packaging structure according to claim 10, wherein particle sizes of the plurality of light reflective particles are in the range of 0.07 microns to 15 microns.

14. The packaging structure according to claim 10, wherein a reflectivity of the plurality of light reflective particles is over 80%, for light in a wavelength range from 200 nm to 400 nm.

15. The packaging structure according to claim 10, wherein the plurality of light reflective particles are barium sulfate particles, or calcium carbonate particles, or a mixture of the barium sulfate particles and the calcium carbonate particles.

16. The packaging structure according to claim 10, wherein a solid content of the plurality of light reflective particles in the sidewall structure is in the range of 5% to 25% by weight.

17. The packaging structure according to claim 10, wherein the light emitting diode chip is an ultraviolet (UV) light emitting diode chip.

18. A packaging structure, comprising:
a substrate layer comprising a mounting surface;
a circuit layer formed on the mounting surface;
a plurality of metal bumps formed on the mounting surface and surrounding the circuit layer;
a sidewall structure disposed in contact with the metal bumps, wherein the sidewall structure comprises a halocarbon polymer matrix and a plurality of light reflective particles uniformly dispersed in the halocarbon polymer matrix; and
a light emitting diode chip mounted on and electrically coupled to the circuit layer, wherein the sidewall structure surrounds the light emitting diode chip;
wherein the sidewall structure is configured for reflecting light emitted from the light emitting diode chip, and the plurality of light reflective particles are configured for increasing a reflectivity of the halocarbon polymer to the light;
wherein the circuit layer comprises a cathode and an anode arranged on the mounting surface; the cathode and the anode both are plate-shaped and located between the mounting surface and the light emitting diode chip.

\* \* \* \* \*